(12) United States Patent
He et al.

(10) Patent No.: US 10,445,348 B2
(45) Date of Patent: Oct. 15, 2019

(54) VIDEO MONITOR LAYOUT

(71) Applicant: ZHEJIANG UNIVIEW TECHNOLOGIES CO., LTD, Hangzhou, Zhejiang (CN)

(72) Inventors: Weiwei He, Zhejiang (CN); Changji Liu, Zhejiang (CN); Qianyan Ye, Zhejiang (CN); Yaqin Chai, Zhejiang (CN)

(73) Assignee: ZHEJIANG UNIVIEW TECHNOLOGIES CO., LTD, Zhejiang (CN)

( * ) Notice: Subject to any disclaimer, the term of this patent is extended or adjusted under 35 U.S.C. 154(b) by 171 days.

(21) Appl. No.: 15/577,466

(22) PCT Filed: May 11, 2016

(86) PCT No.: PCT/CN2016/081736
§ 371 (c)(1),
(2) Date: Nov. 28, 2017

(87) PCT Pub. No.: WO2016/192516
PCT Pub. Date: Dec. 8, 2016

(65) Prior Publication Data
US 2018/0150479 A1    May 31, 2018

(30) Foreign Application Priority Data

May 29, 2015   (CN) .......................... 2015 1 0288095
Aug. 28, 2015   (CN) .......................... 2015 1 0540787

(51) Int. Cl.
*G06F 16/29*   (2019.01)
*G06F 17/50*   (2006.01)
*H04N 7/18*    (2006.01)
*G08B 13/196*  (2006.01)
(Continued)

(52) U.S. Cl.
CPC .............. *G06F 16/29* (2019.01); *G06F 17/50* (2013.01); *G01C 21/32* (2013.01); *G06T 11/40* (2013.01); *G08B 13/196* (2013.01); *H04N 7/18* (2013.01)

(58) Field of Classification Search
CPC ...... G06F 16/29; G06F 17/50; G06F 17/5004; G01C 21/32; G06T 11/40; G08B 13/196
(Continued)

(56) References Cited

U.S. PATENT DOCUMENTS 8,817,102 B2 *  8/2014  Saeki ............... G08B 13/19613
                                                        348/154

FOREIGN PATENT DOCUMENTS

CN    101593457    12/2009
CN    101673282     3/2010
(Continued)

OTHER PUBLICATIONS

State Intellectual Property Office of the People's Republic of China, Office Action and Search Report Issued in Application No. 201510288095.6, dated May 9, 2018, 6 pages, and an English translation of the Office Action.
(Continued)

*Primary Examiner* — Isaac G Smith
(74) *Attorney, Agent, or Firm* — Greenblum & Bernstein, P.L.C.

(57) ABSTRACT

A video monitor layout method and device are provided in the present disclosure. The method includes: determining a plurality of sample points on a map and determining a spatial range to be analyzed based on distribution regions of the plurality of sample points; obtaining grid units of the spatial range by rasterizing the spatial range to be analyzed; assigning a weight to each of the sample points, wherein the weight represents a level of monitor requirement at the sample
(Continued)

point; and acquiring a weight value of each of the grid units according to the weight value of each of the sample points and a positional relationship between each of the sample points and each of the grid units and generating camera distribution position data of the spatial range based on the weight value of each of the grid units.

15 Claims, 7 Drawing Sheets

(51) Int. Cl.
    *G01C 21/32*     (2006.01)
    *G06T 11/40*     (2006.01)

(58) Field of Classification Search
    USPC .............................. 701/438; 348/143, E7.085
    See application file for complete search history.

(56) References Cited

FOREIGN PATENT DOCUMENTS

| CN | 101808230 | 8/2010 |
|---|---|---|
| CN | 101968912 | 2/2011 |
| CN | 102867086 A | 1/2013 |
| CN | 104537068 | 4/2015 |
| CN | 104899368 | 9/2015 |
| CN | 105159978 | 12/2015 |

OTHER PUBLICATIONS

M. Valera et al. "Intelligent distributed surveillance systems: a review"; IEEE Proceedings Vision, Image and Signal Processing. May 9, 2005. 13 pages.

Changhe Cheng et al., "Research and Application of Public Security Monitor Point Planning System based on GIS Platform", China Public Security. Academy Edition, Dec. 31, 2013, pp. 120-124.

Ling Zhang, "The Spatial Layout Design of Surveillance Cameras Based on 3DGIS", China Master's Theses Full-text Database, Oct. 15, 2012, pp. 30-37.

Yawen Fan et al., "Study on Scientific Distribution of Monitoring Camera for City Video Surveillance", Video application & project, Feb. 9, 2011, pp. 107-110.

International Search Report (ISR) in International Patent Application No. PCT/CN2016/081736, dated Aug. 12, 2016.

CN Office action, dated Sep. 21, 2017, Application No. 201510288095.6.

\* cited by examiner

FIG. 10

VIDEO MONITOR LAYOUT

TECHNICAL FIELD

The present disclosure relates to video monitor layout.

BACKGROUND

At present, video monitors have been widely used in urban daily management.

Commonly used camera layout methods include: abstracting an objective world as points (such as intersections, ATMs, etc.), lines (roads), and surfaces (CBDs, large shopping malls, etc.), then calculating a coverage region of monitor points, judging a rationality of the monitor point layout according to whether the coverage region includes the objective world or a degree to which the objective world is included, and adjusting and obtaining a final camera layout requirement diagram according to the judging result to perform a camera layout.

This layout method may take a coverage degree of cameras in a monitored region as a key evaluating parameter. For example, by calculating the coverage degree of the cameras, a detailed situation of camera coverage of the monitored region, etc., one or more indicators of evaluating the layout is established. This process is often complicated. For example, camera coverage involves type, focal length, rotation angle, lens, resolution and installation height of cameras, and monitor targets involve different entities in the objective world. If taking the entities in the objective world into consideration, requirements for data will be increased several-fold, because although a case for one entity may serve as a reference for that of another entity, differences somehow persist between cases for different entities.

Another drawback of this method is that importance of different entities of the objective world is not determined and distinguished, that is, important regions and non-important regions apply a same layout method, which is likely to result in inadequate monitor points in important regions and redundant monitor points in non-important regions.

When evaluating the rationality of a video monitor layout, a key indicator is whether key regions are covered, that is, as many monitor points as possible are arranged in the key regions to ensure that the key regions are fully covered and efficiently monitored. In an overall layout of the monitor points, clear requirements will be generally given based on an object to be monitored, such as covering major banks, supermarkets and other crowded regions. However, abstracting objective things into a data structure of points, lines and surfaces and performing operations based on vector data may ignore nature of the objective things.

For example, in a monitor point layout, it is possible that insufficient cameras are arranged in the key regions where a video acquiring frequency is high while cameras are arranged in some non-key regions with a same density due to ignorance of an actual situation of the regions. This leads to a waste of resources to some extent, and monitor effect of the key regions may be poor as a result of the insufficient arrangement of cameras.

In the related art, for the analysis of a rationality of camera distribution, operating frequencies of cameras may be counted. For example, cameras which are used at a frequency higher than an average may be determined and thus considered that these cameras were reasonably utilized. Cameras with an operating frequency lower than the average may be considered to be unreasonably distributed. However, this analysis method may cause a mis-judgement. For example, for a key region, a plurality of cameras may be usually deployed simultaneously to achieve full coverage of the region. Monitoring of the region by a user is accomplished through a camera group, and the user may often view monitor videos of the camera group, but a frequency of operation for a single camera is not high. In this case, if the frequency of a single camera is counted according to the above method, an analysis result that the group of cameras has a low utilization rate will be obtained, and the analysis result does not comply with the actual situation.

SUMMARY

Due to applications of network maps, basic data, such as POI data, road network data and the like, have made great progress over the past, and these data may objectively reflect a monitor requirement. In a geographic information system, there exists a raster data structure. The raster data structure is a data organization form based on a raster model, indicating division of space into regular grids (hereinafter referred to as a grid unit). A corresponding attribute value may be given to each grid unit to represent a specific attribute that corresponds to a geographic entity. The raster data structure may show an impact of an objective entity on the surroundings vividly. Combined with POI data, the monitor requirement that is based on the POI data may be shown vividly.

According to an aspect of the present disclosure, a video monitor layout method is provided for generating camera distribution position data within a particular spatial range based on sample point data capable of reflecting an objective monitor layout requirement.

According to an example of the present disclosure, the method may include determining a plurality of sample points on a map; determining a spatial range to be analyzed based on distribution regions of the plurality of sample points, and rasterizing the spatial range to be analyzed, so as to obtain grid units of the spatial range; assigning a weight on each of the sample points, where the weight represents a level of monitor requirements at each sample point; and acquiring a weight value of each of the grid units according to the weight of each of the sample points and a positional relationship between each of the sample points and each of the grid units, and generating camera distribution position data of the spatial range based on the weight value of each of the grid units.

Since a weight of a sample point reflects a monitor requirement of an objective world, the camera distribution position data in the spatial range are generated according to the weight value of each of the sample points and the geographical position relationship between each of the sample points and each of spatial positions within the spatial range so that the camera distribution position data may have a high reliability.

Further, according to another example, the method may further include acquiring a monitor intensity matrix which may indicate camera monitor intensities at different spatial positions within the spatial range according to the camera distribution position data of the spatial range; acquiring an operating intensity matrix which may indicate camera operating intensities at different spatial positions within the spatial range according to camera operating log data of the spatial range; and calculating a correlation coefficient between the monitor intensity matrix and the operating intensity matrix and analyzing a degree of rationality of camera distribution within the spatial range based on the correlation coefficient.

By calculating a correlation coefficient between a monitor intensity matrix and an operating intensity matrix in a specific spatial range, whether camera distribution in the spatial range is reasonable may be determined more accurately. For example, the monitor intensity matrix and the operating intensity matrix are usually positively correlated. If it is determined based on the correlation coefficient that they two are not in a due relationship, it may be determined that the camera distribution in the spatial range is to be rationally improved.

In addition, according to another aspect of the present disclosure, a device for lay outing video monitor is provided, including a processor that performs the following blocks by reading and executing machine-executable instructions stored on a storage medium and corresponding to video monitor layout control logic: determining a plurality of sample points on a map; determining a spatial range to be analyzed based on distribution regions of the plurality of sample points, and rasterizing the spatial range to be analyzed so as to obtain grid units of the spatial range; assigning a weight to each of the sample points, where the weight of each of the sample points represents a level of monitor requirements at each sample point; and determining a weight of each of the grid units according to the weight value of each of the sample points and a positional relationship between each of the sample points and each of the grid units, and generating camera distribution position data of the spatial range based on the weight of each of the grid units.

BRIEF DESCRIPTION OF THE DRAWINGS

FIG. 10 is a schematic diagram of an overlapping operation shown according to an exemplary embodiment of the present disclosure.

DETAILED DESCRIPTION OF THE EMBODIMENTS

Exemplary embodiments will be described in detail with reference to the accompanying drawings. In the following description when referring to the accompanying drawings, the same numerals in different drawings denote the same or similar elements unless otherwise indicated. The embodiments described in the following exemplary embodiments are not representative of all embodiments consistent with the present disclosure. Rather, they are merely examples of devices and methods consistent with some aspects of the present disclosure as detailed in the appended claims.

Figure 3A:
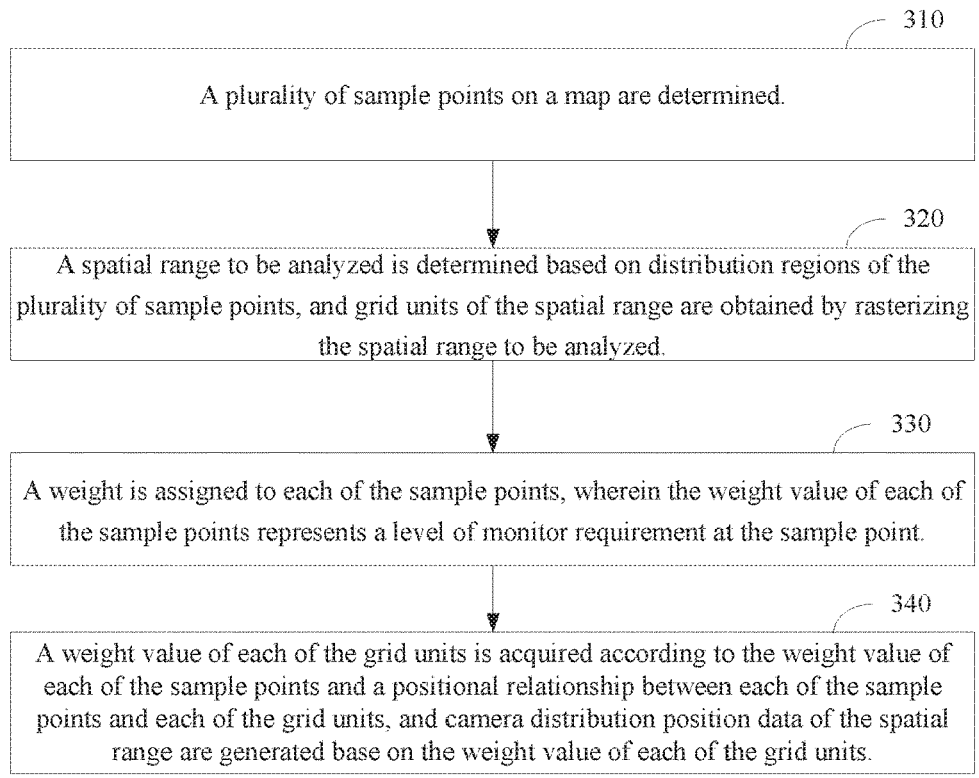
FIG. 3A is a schematic flow diagram of a method for determining a video monitor layout according to an embodiment of the present disclosure.

A video monitor layout method according to an embodiment of the present disclosure may include the following Blocks 310-340 as shown in FIG. 3A.

At Block 310: a plurality of sample points on a map may be determined.

Figure 3B:
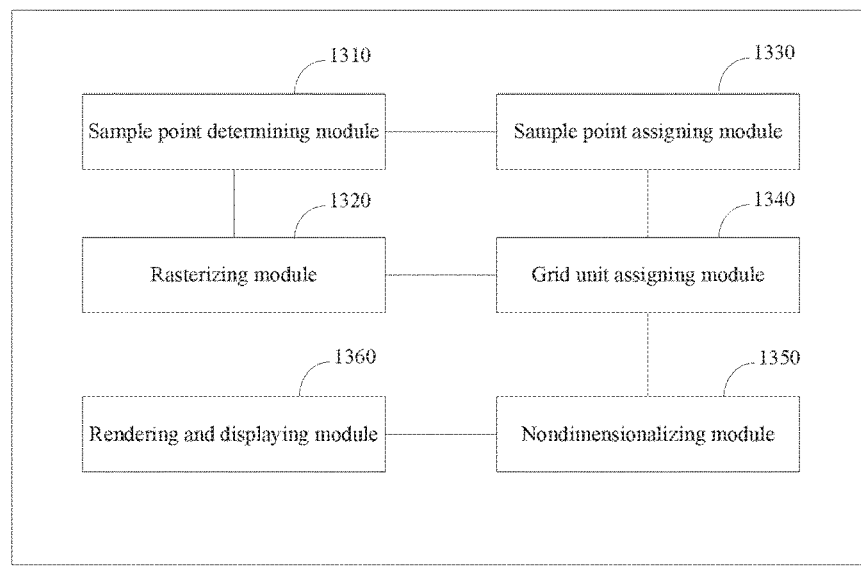
FIG. 3B is a functional module schematic diagram of a device for determining a video monitor layout according to an embodiment of the present disclosure.

Block 310 may be performed by a sample point determining module 1310 shown in FIG. 3B.

A weight of a sample point may reflect data popularity, that is, a degree of importance, of the sample point. Herein the sample point may be a Point of Interest (POI), or a point that is generated based on other distribution rules. For example, based on data of positions where a case occurs, a distribution rule of cases may be acquired; based on existing camera points, a distribution rule of camera points may be acquired. Based on these distribution rules, sample points which may reflect a monitor layout requirement of an objective world to some degree may be acquired.

In other words, there may be several ways to select sample points. For example, the position distribution of cases, existing camera point distribution and the like may be able to reflect a monitor layout requirement. Points corresponding to such positions on a map may be extracted as sample points. In this way, a distribution of POIs may reflect human traffic in a monitored region more comprehensively. For example, the higher a density of POIs in a region, the higher popularity of the region. And thus the region will be a focus of monitor and is to be provided with more cameras. Less dense POIs in a region may indicate that importance of the region may be relatively lower.

Further, the sample points may be POIs on a map. Existing network maps generally have POIs. The POIs may more comprehensively and accurately reflect a distribution of human traffic in the map region.

At Block 320: a spatial range to be analyzed may be determined based on distribution regions of the plurality of sample points, and rasterization may be conducted on the spatial range to be analyzed so as to obtain grid units of the spatial range.

Herein the rasterization may include generating raster data corresponding to the spatial range on the map so as to be able to process latitude and longitude information and attribute value information of each spatial position within the spatial range based on the grid units. For example, the raster data may be a two-dimensional array, and each element in the two-dimensional array may correspond to each grid unit in the map region. The correspondence may include that: index of each element in the two-dimensional array may represent latitude and longitude of a corresponding grid unit, and value of each element in the two-dimensional array may represent weight of a corresponding grid unit.

The Block 320 may be performed by a rasterizing module 1320.

A Digital Elevation Model (DEM) is a solid ground model that represents a ground elevation in an array of ordered values. For ease of operation, raster data that are in a form of DEM (hereinafter referred to as DEM data) may be used. An index of a grid unit may be used to represent latitude and longitude of a corresponding block on a map, and a value of the grid unit may represent a custom attribute. For example, to display a layout requirement, a value of a grid unit may be defined as a weight of the grid unit.

Prior to rasterizing sample points based on DEM data, latitude and longitude may be converted to the indexes of the DEM data to facilitate subsequent assigning and displaying operations. According to an example, a specific method of converting latitude and longitude to the indexes of DEM data may include the following Block 320a and Block 320b to reduce a map region that is subjected to rasterization to a reasonable range so as to reduce complexity of operation and include all sample points at the same time. Herein, to facilitate the operation, the latitude and longitude of the sample points may be converted into coordinates in the Mercator projection coordinate system.

At Block 320a: the maximum and minimum values of longitude of all of the sample points and the maximum and minimum values of latitude of all of the sample points may be determined.

The POIs may be extracted, and the latitude and longitude of the POIs may be converted into coordinates of the Mercator projection coordinate system. The converting formulae may be specifically as follows:

$$x = X * \frac{20037508.34}{180}$$
$$y1 = \ln(\tan((90+Y)*\pi/360))/(\pi/180)$$
$$y = y1 * \frac{20037058.34}{180}$$

Where X is longitude of a POI and Y is latitude of the POI. The coordinate range of the globe in the Mercator projection coordinate system is (−20037508, −20037508, 20037508, 20037508.34).

The minimum value $x_{min}$ and the maximum value $x_{max}$ of all the POIs in the x direction and the minimum value $y_{min}$ and the maximum value $y_{max}$ in the y direction may be calculated to obtain the span of a POI data distribution region:

$$\text{width}=x_{max}-x_{min};$$

$$\text{height}=y_{max}-y_{min}.$$

Where width represents a width of the POI distribution region, and height represents a height of the POI distribution region. In the Mercator projection coordinate system, determining the minimum and maximum longitude values of the POIs may correspond to determining the minimum value $x_{min}$ and the maximum value $x_{max}$ of the POIs in the x direction. Similarly, determining the minimum and maximum latitude values of the POIs may correspond to determining the minimum value $y_{min}$ and the maximum value $y_{max}$ of the POIs in the y direction. In this way, the maximum and minimum values of latitude and longitude may be converted into corresponding coordinate values in the Mercator projection coordinate system, respectively, which may specifically comprises that the maximum and minimum values of longitude correspond to the maximum and minimum values in the x direction of the Mercator projection coordinate system and the maximum and minimum values of latitude correspond to the maximum and minimum values in the y direction of the Mercator projection coordinate system.

At Block 320b: a rectangular region formed by taking map positions corresponding to the maximum and minimum values of longitude and latitude determined at Block 320a as four vertices may be determined as a map region to be rasterized, that is, a spatial range to be analyzed.

The four vertices determined based on the coordinate values corresponding to the maximum and minimum values of longitude and latitude in the Mercator projection coordinate system may form a region such as a rectangle region, which is a map region to be rasterized.

Then, a raster data generating module may apply for a two-dimensional array DemData of a same aspect ratio as the POI distribution region in a memory based on a memory size of a computer and a calculation accuracy requirement. DemData may represent DEM data, where two-dimensional indexes of the array (that is, the row and column positions in the array) may correspond to specific Mercator projection coordinate values, and each value in the array may represent importance of a region. The POI data used in the present embodiment is derived from the main urban area of Hangzhou, and the width of the DEM data DemWidth set may be 5000. In general, the width of the DEM data DemWidth may be set to 5000, and computers with a memory size of 2 G or more are acceptable. In addition, the height of the DEM data DemHeight may be:

$$Demheight = \frac{DemWidth * height}{width}$$

The Mercator projection coordinates of all the POIs may be converted into two-dimensional array indexes of the DEM data. The specific formulae may be as follows:

$$x_{index} = \left[\frac{(x-x\min)*DemWidth}{width}\right]$$
$$y_{index} = \left[\frac{(y-y\min)*DemHeight}{height}\right]$$

In the formulae, square brackets indicate a rounding operation. $x_{index}$ and $y_{index}$ indicate the indexes of elements in a two-dimensional array, respectively. Each element of the DEM data in the form of the two-dimensional array may correspond to each grid unit one to one. An index of each element in the two-dimensional array may correspond to latitude and longitude values of a grid unit. A value of each element may represent a weight of a grid unit.

At Block 330: a weight may be assigned to each of the sample points, where the weight value may represent a level of monitor requirement at the sample point.

The Block 330 may be performed by a sample point assigning module 1330. It is to be noted that this block may be performed after Block 310 and before Block 320, or may be performed after Block 320 and before Block 340, or may be performed concurrently with Block 320. In the present embodiment, Block 330 may be performed after the rasterization is completed at Block 320. In fact, so long as Block 330 is completed before Block 340, any sequence may be acceptable.

As different sample points may reflect different geographical positions on a map, such as municipalities, schools, or entertainment venues, the monitor requirements at each sample point may vary. Thus, the sample points may be classified to be able to assign different weights to the sample points based on importance of different categories.

Influencing factors of layout requirement may be considered when different weights are to be assigned to different categories of sample points. The influencing factors may include, but are not limited to, geographical positions of sample points, human traffic at sample points of different categories, and level of public requirement for sample points of different categories. Herein the geographical positions may include downtown or suburb in the administrative division. In general, downtowns may have greater weights than suburbs. For human traffic, the greater the human traffic, the greater the weight. For example, human traffic at sample points of such a category as shopping malls, hospitals, etc., may be generally large, and human traffic at sample points of such a category as farms, fields, etc., may be generally small. In addition, the public requirement for different categories of sample points may refer to necessities of sample points of different categories. The greater the necessity, the greater the weight. For example, the public requirement at the sample point representing an urban trunk road may be higher, and the weight may be also higher correspondingly. However, for some alternative businesses, such as lottery sales points, public requirement may be lower, and the weight may also be lower.

Further, the classification of sample points may have a plurality of levels. Correspondingly, a hierarchy analyzing method may be used to assign corresponding weights to the sample points. For example, geographic positions that some sample points correspond to may all fall in a larger category, while the larger category may be subdivided into smaller categories of a plurality of levels. For example, the larger category may be government agencies and may include smaller categories such as a central government, local governments, primary organizations, etc. After being divided into a plurality of levels, the hierarchy analyzing method may be applied to assign values to each of the smallest categories many times so as to acquire weight values that may better reflect actual importance of the sample points.

According to an example, assigning weight values to sample points may specifically include classifying POIs and assigning weights based on the categories.

For example, the POIs may be classified according to the existing POI classification table and weights of the POIs are assigned using the hierarchy analyzing method. As shown in Table 1, the classification and the weight values of POIs are shown:

TABLE 1

| Name of a first level | Name of a second level | Weight value | | | |
|---|---|---|---|---|---|
| | | x1 | x2 | x3 | Factor |
| Government agencies A | Central government, provincial and municipal governments, public security institutions, procuratorial institutions and courts | 30 | 30 | 30 | a1 |
| | County/district governments, administrative organs, institutions concerning foreign affairs, seats of local administrative organs, and welfare and service institutions | 25 | 25 | 20 | a2 |
| | Township governments, sub-district offices, and social organizations | 20 | 20 | 15 | a3 |
| | (primary organization) village committees and resident committees | 10 | 15 | 10 | a4 |
| Communications and transportations B | Bus stations, railway stations and airports | 30 | 30 | 30 | b1 |
| | Freight transport sites, logistics sites, ports, wharfs, and metro stations | 25 | 25 | 25 | b2 |
| | Service areas toll stations, and parking lots | 20 | 15 | 20 | b3 |
| | Others | 10 | 10 | 10 | b4 |
| Finances and insurances C | Banks, and securities institutions | 30 | 30 | 30 | c1 |
| | ATMs, and insurance companies | 20 | 20 | 25 | c2 |
| | Lottery | 10 | 10 | 15 | c3 |
| Shopping services D | Supermarkets, shopping malls, and household appliance stores | 30 | 30 | 20 | d1 |
| | Composite markets, and wholesale markets | 20 | 20 | 15 | d2 |
| | Convenience stores, small supermarkets, and outlet | 10 | 15 | 10 | d3 |
| Living services E | Funeral facilities, post offices, business offices, and talent markets | 25 | 25 | 20 | e1 |
| | Business halls, and intermediary organizations | 20 | 20 | 15 | e2 |
| | Agencies, and lottery sales points | 10 | 10 | 10 | e3 |
| | Others | 5 | 5 | 5 | e4 |

TABLE 1-continued

| Name of a first level | Name of a second level | Weight value x1 | x2 | x3 | Factor |
|---|---|---|---|---|---|
| Hotels and restaurants F | Grand hotels, comprehensive restaurants, and star grade hotels | 30 | 30 | 20 | f1 |
|  | Chinese restaurants, western restaurants, snack shops, coffee shops, and hotels | 20 | 25 | 15 | f2 |
|  | Others | 10 | 10 | 10 | f3 |
| Entertainments G | Amusement parks, sports venues, and multi-purpose sports stadiums | 30 | 25 | 20 | g1 |
|  | Entertainment venues, holiday villages, and movie theaters | 25 | 25 | 15 | g2 |
|  | Others | 10 | 10 | 10 | g3 |
| Tourism services H | Tourist attractions, parks, botanical gardens, and plazas | 30 | 30 | 20 | h1 |
|  | Religion sites, and temples | 20 | 15 | 15 | h2 |
|  | Travel agencies | 10 | 10 | 10 | h3 |
| Health care I | Hospitals, health-centers, rehabilitation centers, and emergency centers | 30 | 30 | 30 | i1 |
|  | Houses for the elderly, first-aid stations, and epidemic prevention stations | 20 | 20 | 20 | i2 |
|  | Clinics and drugstores | 10 | 15 | 15 | i3 |
| Cultural & Media J | Schools, venues, media organizations, and libraries | 30 | 30 | 20 | j1 |
|  | Training institutions, scientific research institutions, driving schools, and archives | 20 | 20 | 15 | j2 |
| Corporate businesses K | Companies, urban construction sites, industry plants | 30 | 30 | 20 | k1 |
|  | Farming forestry husbandry and fishing bases | 20 | 15 | 15 | k2 |
|  | Others | 10 | 10 | 10 | k3 |
| Commercial housing and residences L | Buildings | 30 | 25 | 15 | l1 |
|  | Residential areas | 20 | 25 | 10 | l2 |
|  | Others | 10 | 10 | 5 | l3 |
| Automobiles M | Automobile services, and automobile sales | 30 | 25 | 20 | m1 |
|  | Automobile maintenances, and motorcycle services | 20 | 20 | 15 | m2 |
|  | Others | 10 | 10 | 10 | m3 |

Herein the weight values of the POIs may be assigned by, for example, three experts according to their own knowledge of the importance of the POIs, respectively. For example, x1, x2, and x3 may represent the weights assigned by the three experts to a sample point, respectively. In addition, the maximum weight value may be defined as, for example, 30. Then, for the A-M larger categories, the hierarchy analyzing method may be applied to each smaller category, respectively, to obtain the value of each factor.

Taking category A as an example, to construct a judgment matrix, a scale $a_{ij}$ may be introduced, and the meanings corresponding to different values of the scale $a_{ij}$ are as shown in Table 2.

TABLE 2

| Scale $a_{ij}$ | Definition |
|---|---|
| 1 | factor i is as important as factor j |
| 3 | factor i is slightly more important than factor j |
| 5 | factor i is more important than factor j |
| 7 | factor i is much more important than factor j |
| 9 | factor i is absolutely more important than factor j |
| 2, 4, 6, 8 | a scale value corresponding to an intermediate state between a last scale and a next scale |
| reciprocal | if factor i is compared with factor j, the following judgment value may be acquired: $a_{ji} = 1/a_{ij}$, $a_{ii} = 1$ |

For matrix A, the pairwise comparison matrix of the four factors a1, a2, a3 and a4 may be shown in Table 3. Herein the four factors a1, a2, a3 and a4 may represent four second-level categories under first-level category A, respectively.

TABLE 3

| G | a1 | a2 | a3 | a4 |
|---|---|---|---|---|
| a1 | 1 | 3 | 5 | 7 |
| a2 | ⅓ | 1 | 3 | 5 |
| a3 | ⅕ | ⅓ | 1 | 3 |
| a4 | ⅐ | ⅕ | ⅓ | 1 |

In addition, the pairwise comparison matrix in which values are assigned by different experts to the importance of the same factor may be shown in Table 4:

TABLE 4

| a1 | x1 | x2 | x3 | a2 | x1 | x2 | x3 | a3 | x1 | x2 | x3 | a4 | x1 | x2 | x3 |
|---|---|---|---|---|---|---|---|---|---|---|---|---|---|---|---|
| x1 | 1 | 1 | 1 | x1 | 1 | 1 | 3 | x1 | 1 | 1 | 2 | x1 | 1 | ½ | 1 |
| x2 | 1 | 1 | 1 | x2 | 1 | 1 | 3 | x2 | 1 | 1 | 3 | x2 | 2 | 1 | 2 |
| x3 | 1 | 1 | 1 | x3 | ⅓ | ⅓ | 1 | x3 | ½ | ⅓ | 1 | x3 | 1 | ½ | 1 |

After hierarchical ordering is obtained, the following operation may be conducted:

(1) Judgment matrices at each level may be acquired, and consistency tests may be carried out.

First, a consistency test may be carried out on the pairwise comparison matrix of the four factors at the first level.

For example, a judgment matrix A may be obtained from Table 3; and standardization such as normalization may be performed before the consistency test is carried out on the judgment matrix A.

$$A = \begin{Bmatrix} 1 & 3 & 5 & 7 \\ 1/3 & 1 & 3 & 5 \\ 1/5 & 1/3 & 1 & 3 \\ 1/7 & 1/5 & 1/3 & 1 \end{Bmatrix} \rightarrow \begin{Bmatrix} 0.597 & 0.662 & 0.536 & 0.4375 \\ 0.199 & 0.220 & 0.321 & 0.3125 \\ 0.119 & 0.074 & 0.107 & 0.1875 \\ 0.085 & 0.044 & 0.036 & 0.0625 \end{Bmatrix} \quad ①$$

$$\begin{Bmatrix} 0.597 & 0.662 & 0.536 & 0.4375 \\ 0.199 & 0.220 & 0.321 & 0.3125 \\ 0.119 & 0.074 & 0.107 & 0.1875 \\ 0.085 & 0.044 & 0.036 & 0.0625 \end{Bmatrix} \rightarrow \begin{Bmatrix} 2.2325 \\ 1.0525 \\ 0.4875 \\ 0.2275 \end{Bmatrix} \quad ②$$

$$\begin{Bmatrix} 2.2325 \\ 1.0525 \\ 0.4875 \\ 0.2275 \end{Bmatrix} \rightarrow \begin{Bmatrix} 0.558 \\ 0.263 \\ 0.122 \\ 0.057 \end{Bmatrix} = W^{(0)} \quad ③$$

Herein the operation ① is normalization of the column vectors for the judgment matrix A; the operation ② is a sum of respective rows; and ③ is a normalized matrix finally acquired.

After the normalized matrix is obtained, a maximum eigenvalue $\lambda_{max}^{(0)}$ and an eigenvector $W^{(O)}$ of the judgment matrix A may be obtained.

$$AW^{(0)} = \begin{Bmatrix} 1 & 3 & 5 & 7 \\ 1/3 & 1 & 3 & 5 \\ 1/5 & 1/3 & 1 & 3 \\ 1/7 & 1/5 & 1/3 & 1 \end{Bmatrix} \begin{Bmatrix} 0.558 \\ 0.263 \\ 0.122 \\ 0.057 \end{Bmatrix} = \begin{Bmatrix} 2.325 \\ 1.1 \\ 0.4923 \\ 0.23 \end{Bmatrix},$$

$$\lambda_{max}^{(0)} = \frac{1}{4}\left(\frac{2.356}{0.558} + \frac{1.1}{0.263} + \frac{0.4923}{0.122} + \frac{0.23}{0.057}\right) = 4.119,$$

$$W^{(0)} = (0.558, 0.263, 0.122, 0.057)^T.$$

Then, consistency tests may be carried out at the second level on the pairwise comparison matrices between the same factors. Similarly, the maximum eigenvalues and eigenvectors corresponding to the judgment matrices A1, A2, A3 and A4 obtained according to Table 4 may be calculated, which are as follows successively:

$$\lambda_{max}^{(1)}=3, W^{(1)}=(1/3,1/3,1/3)^T$$

$$\lambda_{max}^{(2)}=3, W^{(2)}=(3/7,3/7,1/7)^T$$

$$\lambda_{max}^{(3)}=3.018, W^{(3)}=(0.387,0.443,0.170)^T$$

$$\lambda_{max}^{(4)}=3, W^{(4)}=(0.25,0.5,0.25)^T$$

Where A1 denotes a pairwise comparison matrix between the assignments, x1, x2 and x3, for the secondary category a1 from each expert. Similarly, A2, A3 and A4 denote pairwise comparison matrices between the assignments, x1, x2 and x3, for the secondary category a2, a3, and a4 from each expert, respectively. Correspondingly, $\lambda_{max}^{(1)}$, $\lambda_{max}^{(2)}$, $\lambda_{max}^{(3)}$ and $\lambda_{max}^{(4)}$ are the maximum eigenvalues of judgment matrices A1, A2, A3 and A4, respectively. $W^{(1)}$, $W^{(2)}$, $W^{(3)}$ and $W^{(4)}$ denote the eigenvectors of the judgment matrices A1, A2, A3 and A4.

Consistency index (CI) may be used to test:

$$CI = \frac{\lambda_{max} - n}{n - 1},$$

$$CR = \frac{CI}{RI}.$$

Herein for each matrix order n, the corresponding RI value may be as follows:

| | n | | | | | | | | |
|---|---|---|---|---|---|---|---|---|---|
| | 1 | 2 | 3 | 4 | 5 | 6 | 7 | 8 | 9 |
| RI | 0 | 0 | 0.58 | 0.90 | 1.12 | 1.24 | 1.32 | 1.41 | 1.49 |

For the judgment matrix A, the order n is 4 and the corresponding RI value is 0.90, so that CR=0.044 may be further calculated. CR is less than 0.1, indicating that a degree of inconsistency of the judgment matrix A is within an allowable range. If the consistency test is not passed, sample points may be reclassified or the sample points may be re-assigned directly, and the weight vector may be replaced by the eigenvector of the judgment matrix A. Similarly, for the judgment matrices A1, A2, A3, and A4, the above principle may also be used to conduct a consistency test.

(2) A weight vector matrix is solved to assign a weight to each POI.

$$W_{sum} = (W^{(1)}, W^{(2)}, W^{(3)}, W^{(4)}) = \begin{Bmatrix} 1/3 & 3/7 & 0.387 & 0.25 \\ 1/3 & 3/7 & 0.443 & 0.5 \\ 1/3 & 1/7 & 0.170 & 0.25 \end{Bmatrix}$$

$$W_{total} = W_{sum} W^{(0)} = \begin{Bmatrix} 1/3 & 3/7 & 0.387 & 0.25 \\ 1/3 & 3/7 & 0.443 & 0.5 \\ 1/3 & 1/7 & 0.170 & 0.25 \end{Bmatrix} \begin{Bmatrix} 0.558 \\ 0.263 \\ 0.122 \\ 0.057 \end{Bmatrix} = \begin{Bmatrix} 0.360 \\ 0.382 \\ 0.258 \end{Bmatrix}$$

According to the weight vector matrix, combined with the weight values X1, X2, and X3 given by the three experts, comprehensive influence values may be calculated:

a1=30*0.360+30*0.382+30*0.258=30:

a2=25*0.360+25*0.382+20*0.258=23.71;

a3=20*0.360+20*0.382+15*0.258=18.71;

a4=10*0.360+15*0.382+10*0.258=11.91.

According to this method, a value of each factor in Categories B-M may be obtained.

As may be seen from Block 310, a unique element whose index $x_{index}$ and $y_{index}$ correspond to latitude and longitude of each of the POIs may be found in DEM data. The POIs may denote points of interest of people. The POIs and vicinity of the POIs are regions that people may be concerned about. Therefore, the closer to a POI a region is, the more important the region is, and the stronger a monitor requirement is. The denser a POI density in a region is, the higher the popularity of the region is. For example, the region may be a region where the human traffic is heavy, and the region is to be monitored emphatically and vice versa.

Influence of POIs on the surroundings may attenuate along with distance. Therefore, in the present embodiment of the present disclosure, the attenuation of influence along with the distance may be simulated by setting an influence range and a maximum influence value.

At Block 340: A weight value of each of the grid units may be determined by calculation according to a weight value of each of the sample points and a positional relationship between each of the sample points and each of the grid units, and camera distribution position data of the spatial range may be generated based on the weight value of each of the grid units.

This block may be performed by a grid unit assigning module 1340. Since a sample point has an influence on the surrounding grids and the influence may attenuate as the distance increases, the weight value of each grid unit may be determined according to a weight value of each of the sample points and the positional relationship between each of the sample points and each of the grid units to be able to more accurately reflect the influence of the sample point on the surrounding grids. For example, assume the influence value of the POI is the weight value obtained in Block 330 and represented by "Influence", and the maximum distance of the influence is represented by MaxDistance. The region range $x_{width}$ and $y_{width}$ (in unit of meters) corresponding to the grid unit where the current POI is located may be calculated based on $x_{max}$, $x_{min}$, $y_{max}$, and $y_{min}$ determined in Block 320. In this way, a resolution of DEM data may be calculated in combination with the width DemWidth and the height DemHeight of the DEM data as follows:

$$x_{resolution} = \frac{x_{width}}{DemWidth}$$
$$y_{resolution} = \frac{y_{width}}{DemHeight}$$

Where the resolution of the DEM data may represent the size of each grid unit. In this way, the maximum influence distance of a single sample point on a map may be specified, and the weight component of a single sample point for each grid unit within its influence range may be determined according to the following formula:

$$\left(1 - \frac{Distance}{MaxDistance}\right) * Influence$$

Where Distance represents a distance from a sample point to a grid unit. For a grid unit where the sample point is located, the distance is zero. Influence represents the weight value of the sample point. The weight value of each grid unit is a sum of the weight components of all the sample points for the grid unit. The weight value of the grid unit may be represented by the value of the corresponding element in the DEM data.

The weight value of each grid unit may reflect monitor requirements of a map region corresponding to the grid unit. DEM data may be rendered to visually display the weight values of the grid units on the map. For example, Block 340 may also include the following operation: nondimensionalizing the weight values of the grid units to obtain dimensionless weight raster data.

The nondimensionalization of the values of elements corresponding to grid units in the DEM data may be completed by a nondimensionalizing module 1350. Since the weight values of the grid units are calculated based on the weight values of artificially-set sample points, nondimensionalization may be performed on the weight values of the grid units to obtain the dimensionless weight raster data containing the dimensionless weights of all the grid units so as to relatively accurately reflect the monitor requirements of an objective world. For example, considering the need of rendering, the nondimensionalization may be chosen as minimization so that all weight values after processing are between 0 and 1. The specific processing method may be done by dividing all the values in the DEM data by the maximum value, and the resulting values may represent importance of a region with respect to a region with the strongest monitor requirement in the spatial scope concerned, where a value closer to 1 may mean the region is of more importance, and a value closer to 0 may mean the region is of less importance.

Figure 1:
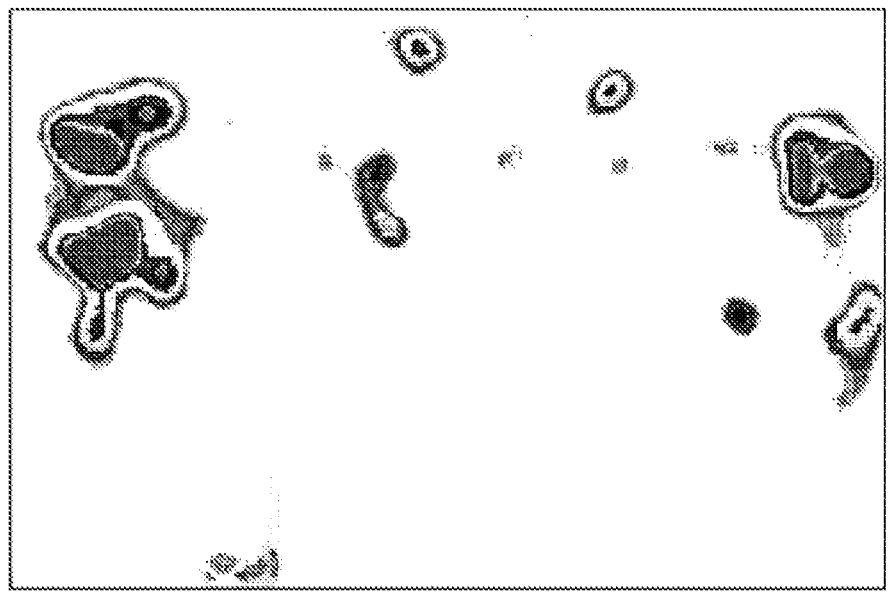
FIG. 1 is a rendering effect diagram of rendering DEM data using a rendering ribbon based on popularity of regions according to an embodiment of the present disclosure.

The minimized DEM data may be rendered by a rendering and displaying module 1360 using a pre-generated rendering ribbon to obtain a rendering diagram. For example, rendering may be performed using corresponding colors based on the degree of importance of the data in the grid unit, and the rendering result is as shown in FIG. 1. There may be a plurality of colors for the rendering ribbon to distinguish different weight values. In the present embodiment, the rendering diagram may be drawn on a picture with a length and width of 100*100 with white as a starting color and black as an ending color.

Figure 2:
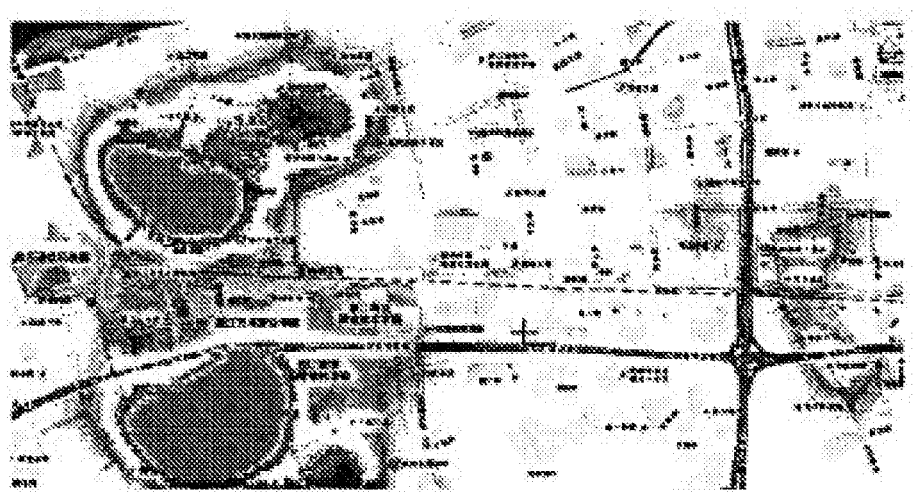
FIG. 2 is an effect diagram in which the rendering effect diagram shown in FIG. 1 and an actual map are overlapped.

The rendering and displaying module 1360 may display the rendering diagram and the map in an overlapped manner to obtain a monitor layout requirement map. Each of the grid units in the DEM data may correspond to true latitude and longitude, therefore the render DEM data may be displayed in the existing map. For example, controlling points at the four corners of each grid unit may be calculated and then drawn in the existing map. The overlapping result of the rendering diagram and the map, that is, the monitor layout requirement map, may be shown in FIG. 2. As may be seen from the figure, in bustling regions, the monitor requirements will be very strong, which are displayed in darker colors, while non-main districts are mainly displayed in white. Camera distribution position data may be then generated by the rendering and displaying module 1360 based on the monitor layout requirement map.

In summary, a weight value of a sample point may reflect a level of the monitor requirement of an objective world at the sample point. The weight values of all the sample points in a region are taken into account when a video monitor layout is carried out so that the monitor layout has a higher reliability.

In addition, the present disclosure also provides a method for analyzing rationality of a camera distribution to evaluate whether the distribution of monitor cameras in a preset spatial range is reasonable.

For example, the preset spatial range may be Binjiang District in Hangzhou, or Haidian District in Beijing, Pudong District in Shanghai, etc. The spatial range to which the method is applied may be set by a user.

The "rationality of the camera distribution" to be evaluated in this method may be that more cameras are arranged in key regions where monitor requirements are strong and fewer cameras are arranged in non-key regions where monitor requirements are weak so that the cameras may be reasonably used and able to meet the monitor requirements.

To achieve a relatively accurate evaluation of the rationality of the camera distribution, the present disclosure is based on the principle of the following camera distribution: there exists a high positive correlation between a monitor intensity of a camera and an operating intensity of the camera. For example, in the key regions that users are more concerned about, more cameras may be arranged, a monitor intensity of this region may be high, and the users may view video recording of the region more frequently; for the non-key region that users are not concerned about, fewer cameras may be arranged, a corresponding monitor intensity is low, and the users may rarely view video recording of the region. Therefore, it may be determined whether an arrangement of cameras is reasonable by determining a relationship between the monitor intensity and the operating intensity of the cameras in a particular spatial range. This analyzing method combines the operation of cameras with spatial information.

Figure 4:
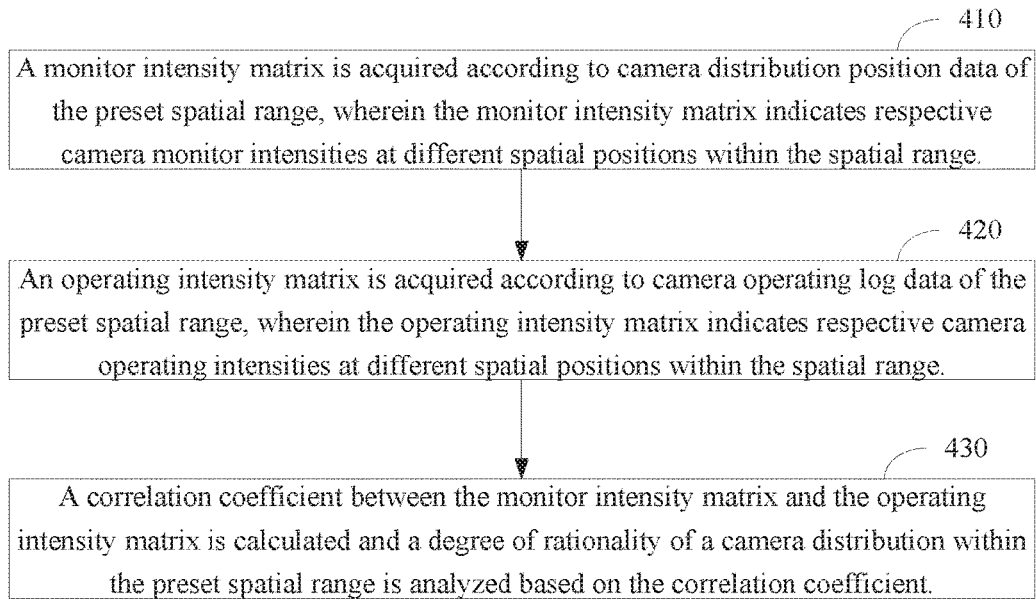
FIG. 4 is a schematic flow diagram of a method for analyzing a degree of rationality of camera distribution shown according to an exemplary embodiment of the present disclosure.

FIG. 4 illustrates the flow diagram of a method for analyzing a degree of rationality of a camera distribution according to the present disclosure. As shown in FIG. 4, the method may include Block 410 to Block 430.

At Block 410: a monitor intensity matrix representing camera monitor intensities at different spatial positions within a preset spatial range may be acquired based on camera distribution position data of the preset spatial range.

At Block 420: an operating intensity matrix representing camera operating intensities at different spatial positions within the preset spatial range may be acquired based on camera operating log data of cameras in the preset spatial range.

At Block 430: a correlation coefficient between the monitor intensity matrix and the operating intensity matrix may be calculated and a degree of rationality of a camera distribution within the preset spatial range may be analyzed based on the correlation coefficient.

Figure 5:
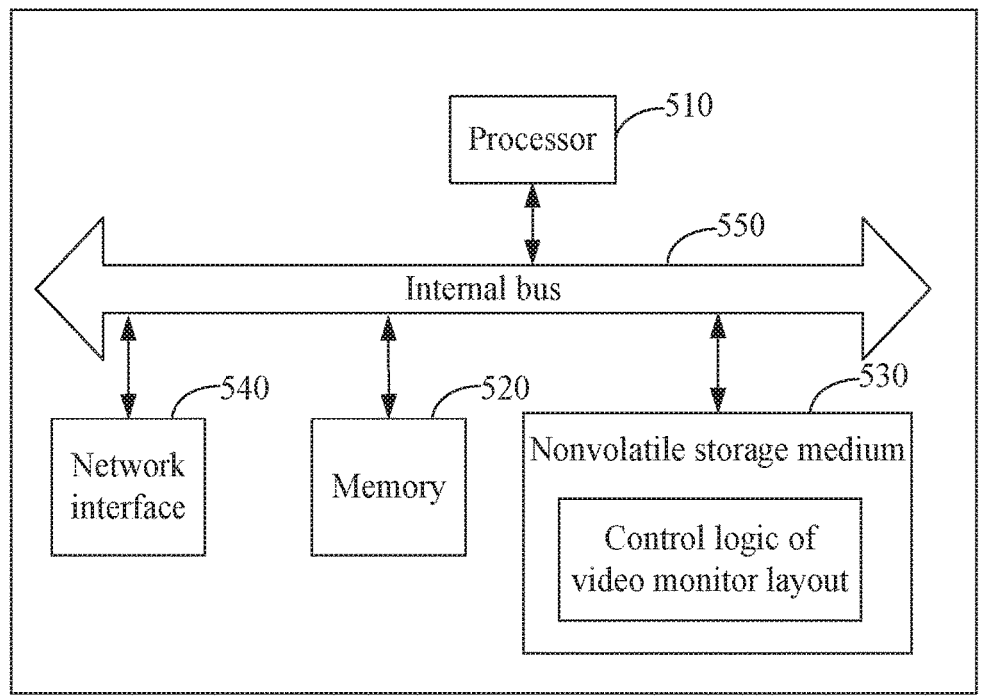
FIG. 5 is a hardware structural diagram of a monitor device shown according to an exemplary embodiment of the present disclosure.

The above method may be implemented by software, for example, whether the distribution of monitor cameras is reasonable may be analyzed by particular monitor software. The monitor software may be run on a physical device, which may be, for example, a monitor device. Taking the monitor device as an example, as shown in FIG. 5, the monitor device may include a processor 510, a memory 520, a non-volatile storage medium 530, and a network interface 540. Herein the hardware may be interconnected via an internal bus 550. In this example, the processor 510 may read control logic of video monitor layout stored in the non-volatile storage medium 530 into the memory 520 for running to perform the method for determining the camera distribution position shown in FIG. 3 and/or the method for analyzing the rationality of the camera distribution shown in FIG. 4.

At Block 410, the camera distribution position data (also referred to as monitor point data) of the preset spatial range may be imported into the software for obtaining the monitor intensity matrix.

Figure 6:
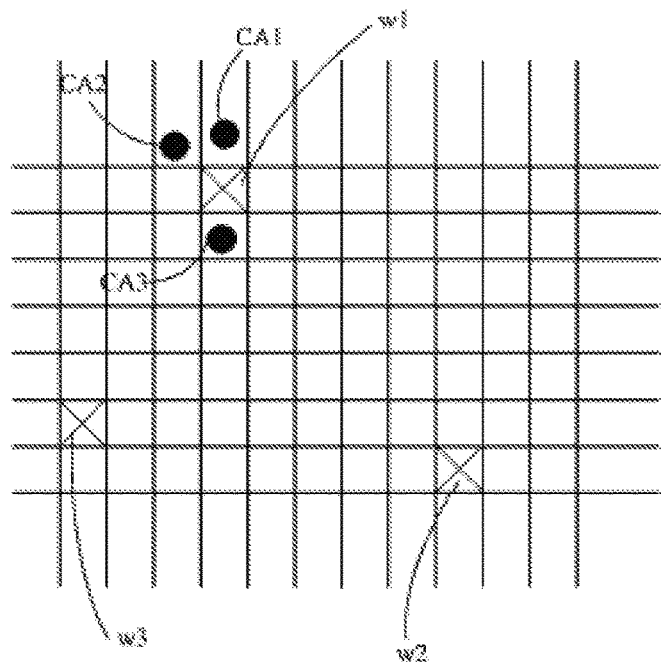
FIG. 6 is a schematic diagram of a spatial grid division shown according to an exemplary embodiment of the present disclosure.

FIG. 6 illustrates a partial region of a preset spatial range. As described above, rasterization may be conducted on the preset spatial range to divide the preset spatial range into regular grids (hereinafter also referred to as grid units). As shown in FIG. 6, part of the spatial range that has been divided is shown. Attribute value may be assigned to each grid. In Block 410 of the present disclosure, the attribute values of the grids may be referred to as "monitor intensity factors". For example, for a grid w1 (represented by a crossover line) in FIG. 6, a corresponding monitor intensity factor that indicates the camera monitor intensity at the grid w1 may be calculated. For example, after the camera distribution position data are imported into the monitor software, cameras are distributed in the spatial range of the grid form, and three cameras may be distributed around the grid w1, which are CA1, CA2 and CA3, respectively. The monitor intensity factor of the grid w1 may be used to indicate the monitor effect that the three cameras CA1, CA2, and CA3 arranged around have on the grid w1.

Moreover, each grid may correspond to a latitude and longitude coordinate in an actual spatial position, and the latitude and longitude coordinate may be converted into a two-dimensional array index of the Digital Elevation Model (DEM). For example, the grid w may be indicated by a two-dimensional array (x, y) index, and this index corresponds to the latitude and longitude coordinate of the actual spatial position represented by the grid w1. In summary, the processing of the preset spatial range in this example may include that after the rasterization is performed on the preset space range, each grid is indicated with a two-dimensional array index. This index is obtained by converting the latitude and longitude coordinate of the actual space corresponding to the grid. For example, a converting method including Block 320a and Block 3202b as described above may be used. However, each grid may be assigned an attribute value. The attribute value is a monitor intensity factor of a corresponding grid as described above which is used to represent the camera monitor intensity at the grid.

Taking the grid w1 as an example to illustrate a calculation of the monitor intensity factor: influence F of each of the three surrounding cameras on the grid may be calculated first, and the influences F of the three cameras are then added to obtain the camera monitor intensity corresponding to the grid. Herein the influence F is a function that has taken into account a characteristic that the monitor effect of the cameras attenuates along with distance. For example, a camera is to monitor the surrounding region and the monitor effect is better for a position closer to the camera, and the monitor effect is worse for a position further from the camera. The calculation formula of the influence F may be expressed as follows:

$$F = \left(1 - \frac{Dis}{DisMax}\right) * \text{Value}$$

Where F is influence, Dis is the distance from a camera, and in this example, the distance may be the distance from the center of the grid w1 to the camera. Value is the influence at a center point. In general, the position of a camera is the center point, because the position is usually where the monitor effect is the best. In this example, the influence Value of the center point may be set to 1000. DisMax is the influence range of a camera, which for example, may be set to 500 meters. Herein the values of DisMax and Value may be changed depending on different cameras.

For example, when calculating influence F1 of the camera CA1 on the grid w1, the distance Dis is the distance between the grid w1 and the camera CA1; when calculating influence F2 of the camera CA2 on the grid w1, the distance Dis is the distance between the grid w1 and the camera CA2; when calculating influence F3 of the camera CA3 on the grid w1, the distance Dis is the distance between the grid w1 and the camera CA3. The monitor intensity factor Y1 of the grid w1 may be calculated finally as follows:

$$Y1 = F1 + F2 + F3.$$

A similar method may be used to calculate monitor intensity factors of other grids in the spatial range in FIG. 6. For example, the monitor intensity factor Y2 of the grid w2, the monitor intensity factor Y3 of the grid w3, etc., may be calculated. Then the integrity formed by the monitor intensity factors corresponding to each grid in FIG. 6 may be referred to as a "monitor intensity matrix" which includes a plurality of monitor intensity factors, each of which is used to represent the camera monitor intensity of one of the grids.

Figure 7:
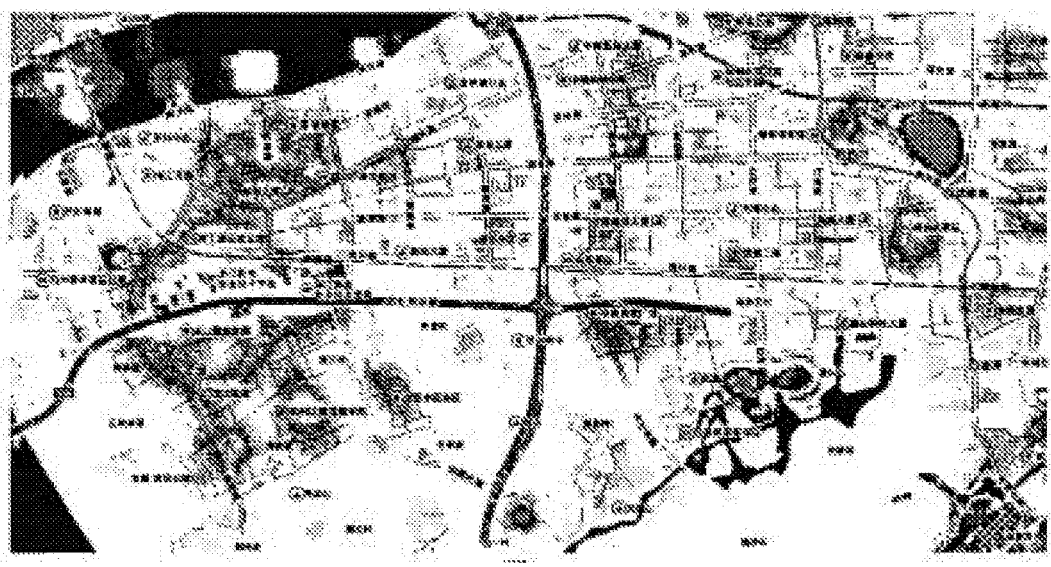
FIG. 7 is a schematic diagram of an effect of rendering a preset spatial region based on monitor intensity factors shown according to an exemplary embodiment of the present disclosure.

In addition, the monitor intensity factor is a dimensionless value and may be subjected to standardization, for example, minimum value standardization, so as to convert each monitor intensity factor in the monitor intensity matrix to a value in the range of 0 to 1. Moreover, different grids of the monitor intensity matrix may be rendered by different colors based on different values of the monitor intensity factors. For example, a grid with a high monitor intensity factor may be rendered in a dark color, a grid with a low monitor intensity factor may be rendered in a light color, and darkness of colors used to render may change gradually. In this way, a monitor intensity diagram of a preset spatial range as shown in FIG. 7 may be generated, where a region in a dark color may indicate that the region has a higher camera monitor intensity, indicating that the camera layout density of these regions may be higher.

At Block 420, an operating intensity matrix may be generated based on camera operation log data. The generation of the operating intensity matrix may still be for the preset spatial range after the rasterization referred to in Block 410, except that the attribute values of the grids are changed from the monitor intensity factors in Block 410 to the operating intensity factors. The integrity of the operating intensity factors of different grids of the preset spatial range forms the operating intensity matrix. It is to be noted that Block 410 and Block 420 may not have a strict execution sequence, and the two blocks may be performed in parallel, or either block may be performed first.

Camera operation log data may be a record stored in a log server. When a user operates a camera, such as viewing a video recording of the camera, invoking a real-time video of the camera, carrying out real-time video capture, etc., the log server usually may record the operation of the user on the camera, including the operation time, the operator and the operation type. The present embodiment may import these data recorded by the log server into software for executing an analyzing method of the present embodiment.

In this example, the recording data of the log server may be classified. For example, the log server may save operation records of a plurality of cameras, and the operation record of each camera may be classified by data classification to obtain a count of operations of each camera. By way of example, the software in this example may send a data acquisition request to the log server requesting access to the camera operation record within a month. In this way, after data transmitted by the log server are received, the count of operations of each camera with a month may be obtained by data classification, and the operating intensity matrix may be constructed by the counts of operations.

At Block 420, the calculation principle of the operating intensity matrix may be similar to that of the monitor intensity matrix. Specifically, the calculation formula of the operating intensity factor in the operating intensity matrix may be referred to the following formula:

$$f = \left(1 - \frac{Dis}{DisMax}\right) * Value * Count$$

According to the above formula, an operating intensity factor corresponding to each grid of a preset spatial range may be calculated. For example, taking the grid w1 in FIG. 6 as an example, the three influences f of three cameras CA1, CA2 and CA3 around the grid w1 on the grid w1 may be calculated, and the three influences f are then added to obtain the operating intensity factor of the grid w1 for indicating the camera operating intensity at the grid. Similarly, the position of a camera itself may be considered to have the highest operating intensity; moreover, the farther away from the camera a grid is, the higher attenuated the operating intensity at the grid is.

In this example, similar to the monitor intensity matrix, standardization may be conducted on the operating intensity factor to convert the value of the operating intensity factor at each grid to a value in the range of 0 to 1. Moreover, similarly, each grid of the preset spatial range may be rendered based on different operating intensity factors using different colors to obtain a camera operating intensity diagram of the preset spatial range.

From the above camera operating intensity diagram, a user may visually see in which region of the preset spatial range cameras may be subjected to a higher operating frequency. The region with a high operating intensity is a key region which will be mainly monitored, so the operation requirements are stronger. Similarly, regions having more densely arranged cameras may be visually seen from the monitor intensity diagram. The region with a high monitor intensity is a key region which will be mainly monitored.

At Block 430, a correlation analysis may be conducted on the monitor intensity matrix and the operating intensity matrix which are obtained above, to acquire a correlation coefficient. When performing calculations, the same two-dimensional array index in the monitor intensity matrix and the operating intensity matrix may be set to represent the same geographic position. For example, a particular two-dimensional array index of the monitor intensity matrix and the same two-dimensional array index of the operating intensity matrix may correspond to the same region position within the preset spatial range.

The calculating method of a correlation coefficient may be described in detail as follows. Assuming that X is a monitor intensity matrix and Y is an operating intensity matrix, a covariance Cov(X, Y) between the monitor intensity matrix X and the operating intensity matrix Y may be calculated according to the covariance calculation formula as follows:

$$Cov(X, Y) = E\{(X - E(X))(Y - E(Y))\}.$$

Here, mean value of samples may be taken as expected values E(X) and E(Y).

The standard deviation $\sigma_X$ and $\sigma_Y$ of the monitor intensity matrix X and the operating intensity matrix Y may be calculated according to the following standard deviation calculation formula:

$$\sigma = \sqrt{\frac{1}{N} \sum_{i=1}^{N} (X_i - u)^2}$$

Where u is the mean value of samples and N is the number of samples.

After standard deviations $\sigma_X$ and $\sigma_Y$ of the monitor intensity matrix X and the operating intensity matrix Y are calculated, the correlation coefficient between the two matrices may be calculated based on the covariance Cov(X, Y) between the two matrices as follows:

$$\rho = \frac{\text{Cov}(X, Y)}{\sigma_X * \sigma_Y}$$

The correlation coefficient ρ calculated here is a dimensionless value. The degree of rationality of a camera distribution within a preset spatial range may be evaluated based on the calculated correlation coefficient. For example, the degree of rationality may indicate that the camera distribution within the preset spatial range is very reasonable, relatively reasonable, moderately reasonable, unreasonable, or very unreasonable.

Figure 8:
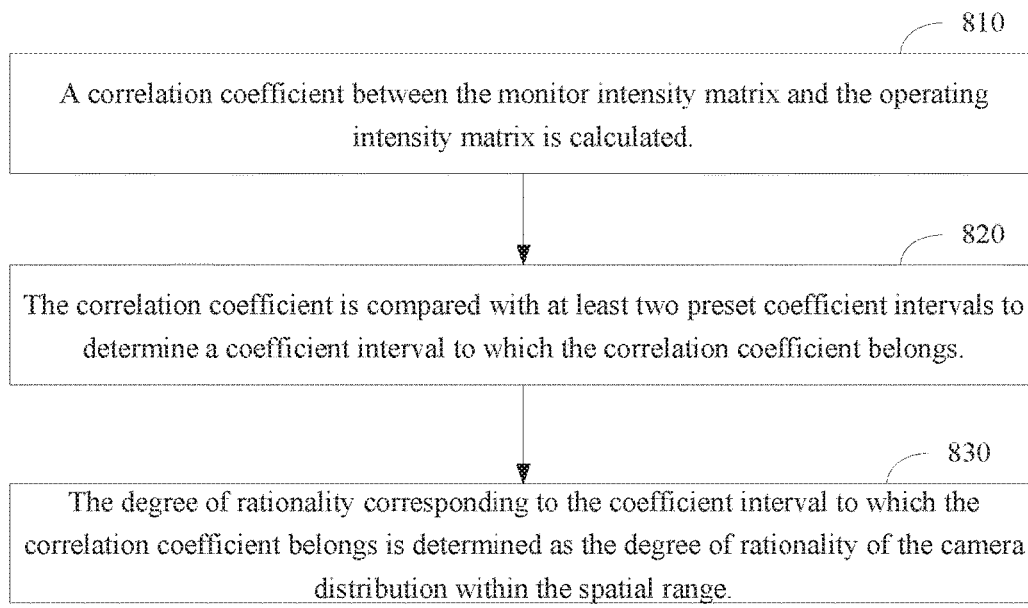
FIG. 8 is a schematic flow diagram of a method for evaluating a degree of rationality of a camera distribution based on a correlation coefficient between a monitor intensity matrix and an operating intensity matrix shown according to an exemplary embodiment of the present disclosure.

FIG. 8 illustrates a schematic flow diagram of a method for evaluating the degree of rationality of a camera distribution based on a correlation coefficient between a monitor intensity matrix and an operating intensity matrix. As shown in FIG. 8, at Block 810, the correlation coefficient of the monitor intensity matrix and the operating intensity matrix in a preset spatial range may be calculated. The correlation coefficient may be calculated in the manner described in the above embodiment, which will not be described in detail.

At Block 820: The correlation coefficient may be compared with at least two preset coefficient intervals to determine a coefficient interval to which the correlation coefficient belongs.

The at least two coefficient intervals may correspond to different degrees of rationality, respectively. In this example, the following coefficient intervals may be set.

Interval 1: Correlation coefficient ρ=1. When the correlation coefficient ρ is located in this interval, it may mean that the distribution of monitor cameras is completely correlated with the distribution of operating intensity, and the camera distribution is very reasonable.

Interval 2: 0.8<ρ<1. When the correlation coefficient ρ is located in this interval, it may be considered that the distribution of the monitor cameras is highly correlated with the operating intensity, the camera distribution is relatively reasonable, and distribution and operation of the cameras may basically meet objective requirements.

Interval 3: 0.3<ρ<0.8. When the correlation coefficient ρ is located in this interval, it may be considered that the distribution of the cameras is moderately reasonable and is to be improved.

Interval 4: 0<ρ<0.3. When the correlation coefficient ρ is located in this interval, it may be considered that the distribution of the cameras is not reasonable and is to be improved.

Interval 5: ρ<0. When the correlation coefficient ρ is located in this interval, it may be considered that the distribution of the cameras is very unreasonable. For example, operations of cameras in the region where the cameras are densely distributed are not frequent, and the cameras are basically in idle state; or, the region where cameras are less distributed is an important region of concern, and the cameras are used at a high frequency. Therefore, a camera point layout is to be improved.

The above several coefficient intervals are just taken as an example, and there may also be other ways of dividing the intervals in the actual implementations. At this block, the correlation coefficient calculated at Block 810 may be compared with the above several coefficient intervals to determine which coefficient interval the correlation coefficient is located in.

At Block 830: The degree of rationality corresponding to the coefficient interval to which the correlation coefficient belongs may be determined as the degree of rationality of the camera distribution within the preset spatial range.

For example, assume that the calculated correlation coefficient is 0.6. Since 0.6 is located in the interval 3 enumerated in Block 820 for which the corresponding degree of rationality is moderately reasonable, it is considered that the camera distribution is moderately reasonable and is to be improved.

For another example, assume that the calculated correlation coefficient is 0.9. Since 0.9 is located in the interval 2 enumerated in Block 820, it may be considered that the camera distribution is relatively reasonable and that the distribution and operation of the cameras substantially meet the objective requirements.

The method for analyzing the rationality of the camera distribution of the present embodiment may evaluate whether the distribution of cameras is reasonable based on the correlation between operating intensity and spatial distribution by combining the operating intensity and the spatial distribution of the cameras. This method is in coincidence with the characteristics that the monitor intensity and the operating intensity are positively correlated, so that accurate rationality analysis results may be obtained. Moreover, by comparing the correlation coefficient with several preset coefficient intervals to analyze the rationality, the evaluation of the rationality of the camera distribution may be made more refined and accurate.

Figure 9:
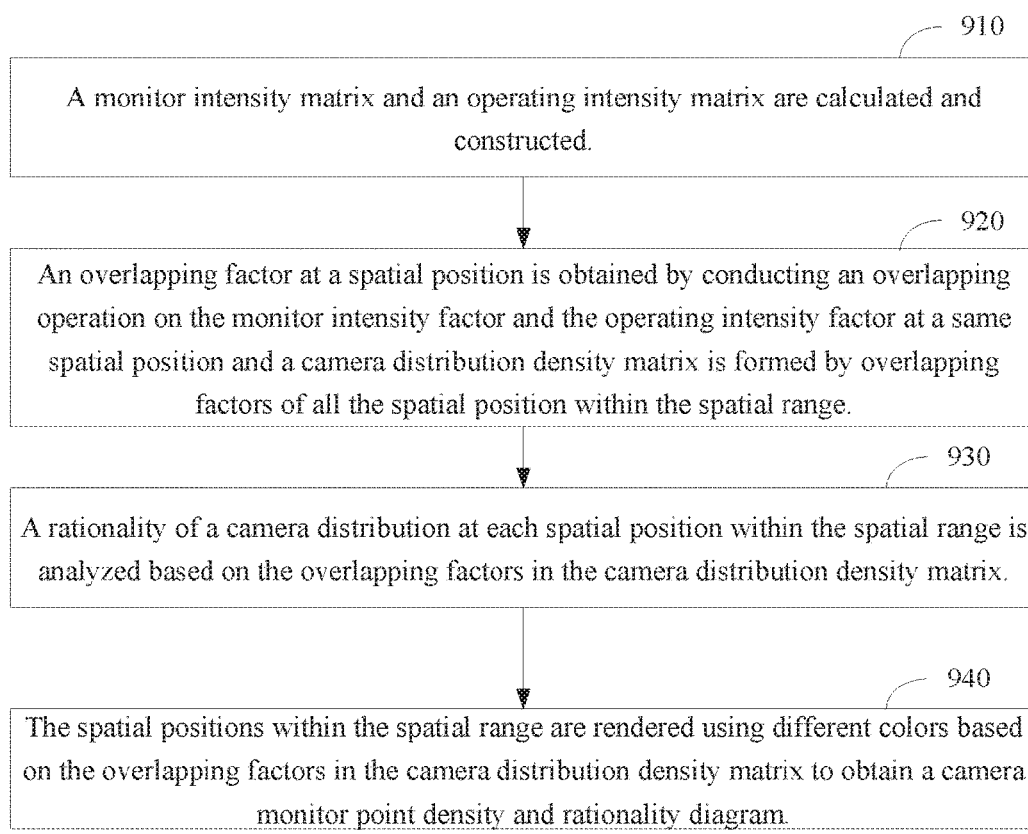
FIG. 9 is a schematic flow diagram of a method for evaluating a degree of rationality of a camera distribution shown according to another exemplary embodiment of the present disclosure.

In the above example, it is possible to evaluate whether a monitor camera layout in the preset spatial range is reasonable as a whole based on the correlation coefficient between the monitor intensity matrix and the operating intensity matrix. However, still further, it is possible to analyze the rationality of the camera distribution in each region within the preset spatial range. For example, through the method shown in FIG. 4, it may be determined that the overall monitor layout in Binjiang District of Hangzhou is reasonable. Specifically for each region in Binjiang District, it may be analyzed through the method shown in FIG. 9 whether the camera distribution is reasonable.

At Block 910: The monitor intensity matrix and the operating intensity matrix of the preset spatial range may be calculated and constructed.

The calculating method of the two matrices in this block may refer to Block 410 and Block 420 in the flow diagram shown in FIG. 4, which will not be described in detail. Herein the monitor intensity matrix may include monitor intensity factors representing the camera monitor intensity at different spatial positions, respectively; and the operating intensity matrix may include operating intensity factors representing the camera operating intensity at different spatial positions, respectively.

At Block 920: An overlapping operation may be conducted on the monitor intensity factor and the operating intensity factor at the same spatial position to obtain an overlapping factor, where the overlapping factors of all the spatial positions within the preset spatial range form a camera distribution density matrix.

The overlapping operation of the present block may be realized by a spatial overlapping analysis, that is, an overlapping operation is conducted on the monitor intensity factor and the operating intensity factor at the same spatial position within the preset spatial range to obtain overlapping result data of a camera distribution with respect to a camera operation at the same spatial position. Herein the overlapping result is also referred to as an overlapping factor hereinafter.

For example, as shown in FIG. 6, the preset spatial range may be divided into grids. Moreover, the monitor intensity factors in the monitor intensity matrix and the operating intensity factors in the operating intensity matrix are subjected to the minimization, that is, scaling data to a specific interval such as [−1, +1], [0, 1], etc. In this way, the value of each factor reflects a relative value of the intensity at the current position relative to the maximum intensity of a region and is a dimensionless value. In addition, a same two-dimensional array index of the two matrices represents the same geographical position. Therefore, when the spatial overlapping analysis is performed, the data of the two matrices may be subtracted.

Figure 10:
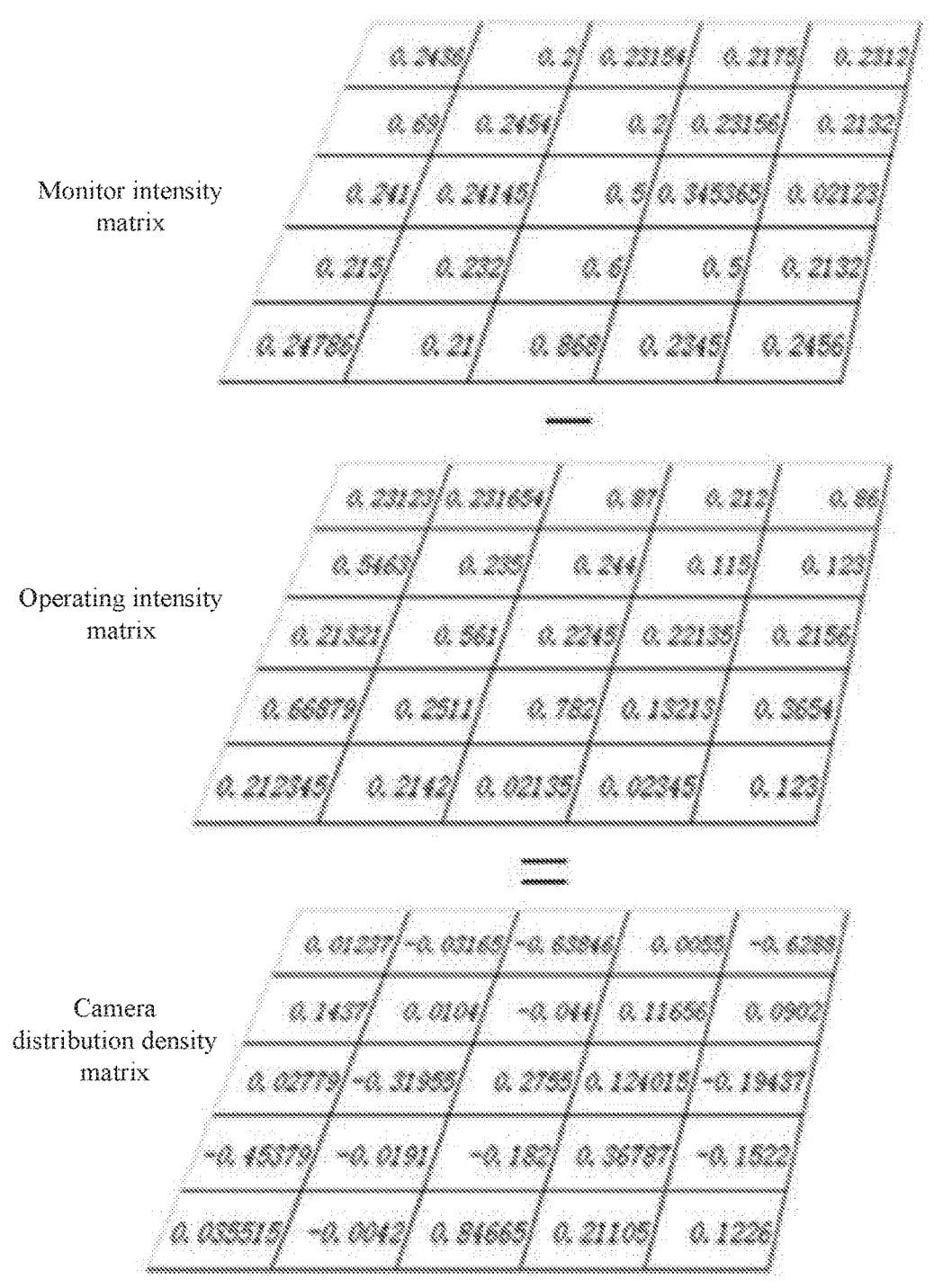

Referring to the example of FIG. 10, the overlapping factor may be obtained by subtracting the operating intensity factor from the monitor intensity factor corresponding to the same spatial position (i.e., the position corresponding to the same two-dimensional array index) within the preset spatial range. Herein the monitor intensity factor and the operating intensity factor are both greater than 0 and less than 1. For example, in the grid of the example shown in FIG. 10, a datum corresponding to a grid position in the operating intensity matrix may be subtracted from a datum corresponding to the same grid position in the monitor intensity matrix. Taking the first grid in the upper left corner as an example, "0.2436−0.23123=0.01237", where 0.01237 may be referred to as an overlapping factor. Similar to the calculation for the grid, each of other grids may have a corresponding overlapping factor.

A matrix formed by all overlapping factors may be referred to as a camera distribution density matrix, that is, a point distribution density map in FIG. 10.

At Block 930: The degree of rationality of the camera distribution at each spatial position of the preset spatial range may be analyzed based on the camera distribution density matrix.

For example, when analyzing the degree of rationality of the camera distribution at each spatial position, the analysis may be performed based on the overlapping factor at the grid position corresponding to each two-dimensional array index. Moreover, a threshold value may be preset, and the overlapping factor obtained in Block 920 may be then compared with the preset threshold value to analyze the rationality of the camera distribution at each grid position.

Specifically, it may be determined that the camera distribution density at a spatial position is too high relative to the camera operating intensity if an overlapping factor in the camera distribution density matrix is greater than the preset threshold. It may be determined that the camera distribution density at a spatial position is too low relative to the camera operating intensity if an overlapping factor in the camera distribution density matrix is less than the preset threshold.

For example, assume that the preset threshold value is 0 and the overlapping factor is between −1 and +1. In this case, if the overlapping factor is greater than 0, it is determined that the camera distribution density at the spatial position is too high relative to the camera operating intensity; and if the overlapping factor is less than 0, it is determined that the camera distribution density at the spatial position is too low relative to the camera operating intensity. For example, still taking the first grid in the upper left corner as an example, "0.2436−0.23123=0.01237". Since the overlapping factor 0.01237 is greater than 0, the camera distribution density in the grid region is too high relative to the camera operating intensity, and the number of cameras in the grid region may be reduced appropriately.

Optionally, after the degree of rationality of the camera distribution at each spatial position of the preset spatial range is analyzed based on the camera distribution density matrix at Block 930, Block 940 may be further performed, in which spatial positions in the map of the preset spatial range are rendered in different colors based on the overlapping factors in the camera distribution density matrix to obtain a monitor point density and rationality diagram of the preset spatial range.

For example, the monitor point density and rationality diagram may be obtained by rendering the grids corresponding to the overlapping factors of >0 and <0 into different colors. For example, red may be used to indicate a region of low point density, and blue may be used to indicate a region of high point density. In the actual analysis, it may be seen that more cameras have not been operated and have been in idle state in the blue region, and camera videos are called more frequently in the red region.

The corresponding monitor intensity matrix and the operating intensity matrix may be obtained by quantizing the spatial distribution data and the operating log data of cameras in a map, and the distribution and the use of the cameras in the map may be clearly shown by rendering different colors based on the data in the matrices. Moreover, the different grid regions in the map show density of the camera distribution in different colors, clearly enabling a decision maker to be aware of the current degree of rationality of the camera distribution which is very intuitive.

In addition, a data standardization method in an embodiment of the present disclosure is not limited to the minimization method, and other methods may be used. The influence F is an empirical function attenuating along with a distance, and may be supplemented by other factors to optimize the calculating formula of the influence F. Moreover, in an overlapping operation, the manner of the overlapping operation is not limited to subtracting the operating intensity factor from the corresponding monitor intensity factor.

Figure 11:
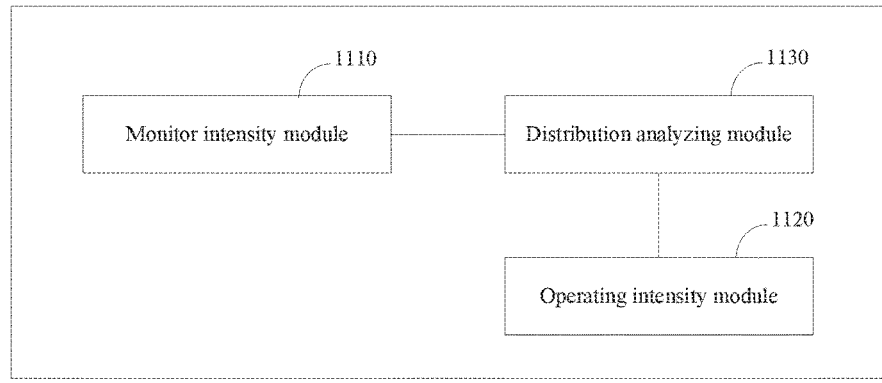
FIG. 11 is a functional module block diagram of a device for analyzing a degree of rationality of a camera distribution shown according to an exemplary embodiment of the present disclosure.

To achieve the above method for analyzing the rationality of a camera distribution, the present embodiment further provides a device for analyzing the rationality of a camera distribution. The device may be implemented as monitor software and may be integrated with a functional module corresponding to control logic of the video monitor layout as shown in FIG. 5. As shown in FIG. 3B, the device may include a sample point determining module 1310, a rasterizing module 1320, a sample point assigning module 1330, a grid unit processing module 1340, a nondimensionalization module 1350, and a rendering and displaying module 1360. As shown in FIG. 11, the device may include a monitor intensity module 1110, an operating intensity module 1120, and a distribution analyzing module 1130.

Herein the monitor intensity module 1110 may be configured to acquire a monitor intensity matrix representing camera monitor intensity at different spatial positions within a preset spatial range, according to camera distribution position data of the preset spatial range.

The operating intensity module 1120 may be configured to acquire an operating intensity matrix representing camera operating intensity at different spatial positions within the preset spatial range according to camera operating log data of the preset spatial range.

The distribution analyzing module 1130 may be configured to calculate a correlation coefficient between the monitor intensity matrix and the operating intensity matrix and analyze a degree of rationality of the camera distribution within the preset spatial range based on the correlation coefficient.

Further, the distribution analyzing module 1130 may be configured to compare the correlation coefficient with at least two preset coefficient intervals to determine a coefficient interval to which the correlation coefficient belongs, and determine the degree of rationality corresponding to the coefficient interval to which the correlation coefficient belongs as the degree of rationality of the camera distribution within the preset spatial range, when analyzing the degree of rationality of the camera distribution within the preset spatial range based on the correlation coefficient.

Figure 12:
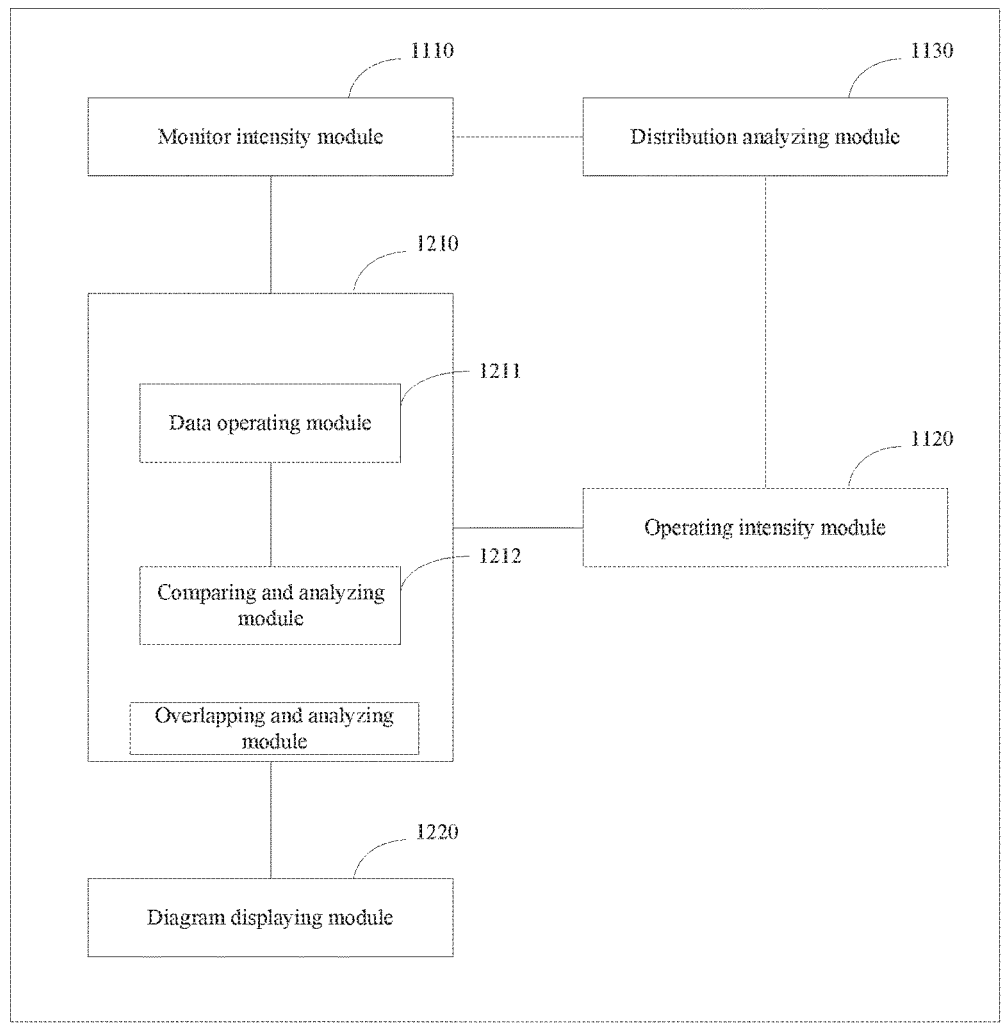
FIG. 12 is a functional module block diagram of a device for analyzing a degree of rationality of a camera distribution shown according to another exemplary embodiment of the present disclosure.

As shown in FIG. 12, the analyzing device may further include an overlapping analyzing module 1210 configured to: conduct an overlapping operation on a monitor intensity factor and an operating intensity factor corresponding to a same spatial position within the preset spatial range to obtain an overlapping factor, where the overlapping factors of all the spatial positions within the preset spatial range form a camera distribution density matrix; and the degree of rationality of the camera distribution at each spatial position within the preset spatial range may be analyzed according to the camera distribution density matrix. Herein the monitor intensity matrix may include monitor intensity factors representing camera monitor intensity at each spatial position, respectively. The operating intensity matrix may include operating intensity factors representing camera operating intensity at each spatial position, respectively.

Further, the overlap analyzing module 1210 may include a data operating unit 1211 and a comparing and analyzing unit 1212. The data operating unit 1211 may be configured to subtract the operating intensity factor from the monitor intensity factor corresponding to the same spatial position within the preset spatial range to obtain the overlapping factor. The comparing and analyzing unit 1212 may be configured to analyze the degree of rationality of the camera distribution at each spatial position based on the overlapping factors. For example, it is determined that the camera distribution density at a spatial position is too high relative to the camera operating intensity if an overlapping factor in the camera distribution density matrix is greater than a preset threshold value; and it is determined that the camera distribution density at a spatial position is too low relative to the camera operating intensity at the same spatial position when an overlapping factor in the camera distribution sparse matrix is less than the preset threshold value.

The device is implemented as software as an example. Monitor software for implementing a method for analyzing the rationality of a camera distribution of the present disclosure may include only the data operating unit 1211 so that the overlapping factors may be displayed in the software. For example, the overlapping factor obtained by subtracting the operating intensity factor from the operating intensity factor corresponding to a particular grid is 0.213, and the result may be displayed at the grid on a map. Alternatively, it is displayed that the range of the result is greater than 0. A user may judge the density of the camera distribution based on the overlapping factor. Alternatively, the software may include the data operating unit 1211 and the comparing and analyzing unit 1212. The camera distribution density result may be obtained by the software according to the overlapping factor, for example the distribution is too sparse, and the result may be displayed in the corresponding grid region.

Further, the analyzing device may further include a diagram displaying module 1220 configured to render the corresponding spatial positions in the map of the preset spatial range with different colors based on the overlapping factors in the camera distribution density matrix, to obtain a point density and rationality diagram of the preset spatial range.

The foregoing is intended only as a preferred embodiment of the present disclosure, and any modifications, equivalent substitutions, improvements, and the like made within the spirit and principle of the present disclosure should be included within the scope claimed by the present disclosure.

The invention claimed is:

1. A method of laying out video monitors, comprising:
   determining a plurality of sample points on a map;
   determining a spatial range to be analyzed based on distribution regions of the plurality of sample points;
   obtaining grid units of the spatial range by rasterizing the spatial range to be analyzed;
   assigning a weight to each of the sample points, wherein the weight of each of the sample points represents a level of monitor requirement at each of the sample points; and
   acquiring a weight value of each of the grid units according to the weight of each of the sample points and a positional relationship between each of the sample points and each of the grid units, and
   generating camera distribution position data of the spatial range based on the weight value of each of the grid units.

2. The method according to claim 1, wherein assigning the weight to each of the sample points comprises:
   determining a category of each of the sample points by classifying each of the sample points, and
   assigning a weight to each of the sample points based on the category of each of the sample points,
   wherein the weight is assigned to each of the sample points by using a hierarchical analyzing method in a case that the classification of the sample points has a plurality of levels.

3. The method according to claim 1, wherein acquiring the weight value of the grid unit according to the weight of each of the sample points and the positional relationship between each of the sample points and the grid unit comprises:
   specifying a maximum influence distance of a single sample point on the map;
   determining a weight component of the single sample point on the grid unit within its influence range according to the following formula:

$$\left(1 - \frac{\text{Distance}}{\text{MaxDistance}}\right) * \text{Influence};$$

wherein MaxDistance represents the maximum influence distance of the single sample point,
   Distance represents a distance from the single sample point to the grid unit, and
   Influence represents a weight of the single sample point; and
   acquiring the weight value of the grid unit by adding weight components of all the sample points on the grid unit.

4. The method according to claim 1, wherein determining the spatial range to be analyzed based on distribution regions of the sample points comprises:
   determining maximum and minimum longitude and latitude values of all of the sample points; and determining a region with map positions corresponding to the determined maximum and minimum longitude and latitude values as four vertices as the spatial range to be analyzed.

5. The method according to claim 1, wherein generating the camera distribution position data of the spatial range based on the weight value of each of the grid units comprises:

obtaining dimensionless weight raster data by nondimensionalizing the weight value of each of the grid units, wherein the dimensionless weight raster data comprise a dimensionless weight of each of the grid units;

obtaining a rendering diagram by rendering the dimensionless weight raster data, wherein different dimensionless weights are represented by different colors; and generating a monitor layout requirement diagram of the spatial range by overlapping the rendering diagram to the spatial range on the map, and generating the camera distribution position data of the spatial range based on the monitor layout requirement diagram.

6. The method according to claim 1, further comprising:

acquiring a monitor intensity matrix according to the camera distribution position data of the spatial range, wherein the monitor intensity matrix indicates respective camera monitor intensities at different spatial positions within the spatial range;

acquiring an operating intensity matrix according to camera operating log data of the spatial range, wherein the operating intensity matrix indicates respective camera operating intensities at different spatial positions within the spatial range;

calculating a correlation coefficient between the monitor intensity matrix and the operating intensity matrix; and analyzing a degree of rationality of a camera distribution within the spatial range based on the correlation coefficient.

7. The method according to claim 6, wherein analyzing the degree of rationality of the camera distribution within the spatial range based on the correlation coefficient comprises:

determining a coefficient interval to which the correlation coefficient belongs by comparing the correlation coefficient with at least two preset coefficient intervals; and determining the degree of rationality corresponding to the coefficient interval to which the correlation coefficient belongs as the degree of rationality of the camera distribution within the spatial range.

8. The method according to claim 6, wherein the monitor intensity matrix comprises monitor intensity factors representing the camera monitor intensity at each spatial position within the spatial range, respectively;

the operating intensity matrix comprises operating intensity factors representing the camera operating intensity at each spatial position within the spatial range, respectively; and the method further comprises:

obtaining an overlapping factor at the spatial position by conducting an overlapping operation on the monitor intensity factor and the operating intensity factor corresponding to a same spatial position, and analyzing a degree of rationality of the camera distribution at each spatial position within the spatial range based on the overlapping factor.

9. The method according to claim 8, wherein the overlapping operation comprises: subtracting the operating intensity factor from the monitor intensity factor; and analyzing the degree of rationality of the camera distribution at each spatial position within the spatial range based on the overlapping factor comprises:

determining that the camera distribution density at a spatial position within the spatial range is too high relative to the camera operating intensity at the spatial position when the overlapping factor is greater than a preset threshold value; and determining that the camera distribution density at a spatial position within the spatial range is too low relative to the camera operating intensity at the spatial position when the overlapping factor is less than the preset threshold value.

10. A device for video monitor layout, comprising a processor that performs the following operations by reading and executing machine-executable instructions stored on a storage medium and corresponding to control logic of the video monitor layout:

determining a plurality of sample points on a map;

determining a spatial range to be analyzed based on distribution regions of the plurality of sample points;

obtaining grid units of the spatial range by rasterizing the spatial range to be analyzed;

assigning a weight to each of the sample points, wherein the weight of each of the sample points represents a level of monitor requirement at the sample point; and acquiring a weight value of each of the grid units according to the weight of each of the sample points and a positional relationship between each of the sample points and each of the grid units; and generating camera distribution position data of the spatial range based on the weight value of each of the grid units.

11. The device according to claim 10, wherein when acquiring the weight value of each of the grid units according to the weight value of each of the sample points and the positional relationship between each of the sample points and each of the grid units, the machine-executable instructions cause the processor to:

specify a maximum influence distance of a single sample point on the map;

determine a weight component of the single sample point on the grid unit within its influence range according to the following formula:

$$\left(1 - \frac{\text{Distance}}{\text{MaxDistance}}\right) * \text{Influence};$$

wherein MaxDistance represents the maximum influence distance of the single sample point, Distance represents a distance from the single sample point to the grid unit, and Influence represents a weight of the single sample point; and acquiring the weight value of the grid unit by adding weight components of all the sample points on the grid unit.

12. The device according to claim 10, wherein when determining the spatial range to be analyzed based on distribution regions of the sample points, the machine-executable instructions cause the processor to:

determine maximum and minimum longitude and latitude values of all of the sample points; and determine a region with map positions corresponding to the determined maximum and minimum longitude and latitude values as four vertices as the spatial range to be analyzed.

13. The device according to claim 10, wherein when generating camera distribution position data of the spatial range based on the weight value of each of the grid units, the machine-executable instructions cause the processor to:

obtaining dimensionless weight raster data by nondimensionalizing the weight value of each of the grid units, wherein the dimensionless weight raster data comprise a dimensionless weight of each of the grid units;

obtaining a rendering diagram by rendering the dimensionless weight raster data, wherein different dimensionless weights are represented by different colors; and generate a monitor layout requirement diagram of the spatial range overlapping the rendering diagram to the spatial range on the map, and generate the camera distribution position data of the spatial range based on the monitor layout requirement diagram.

14. The device according to claim 10, wherein the machine-executable instructions further cause the processor to:

acquire a monitor intensity matrix according to the camera distribution position data of the spatial range, wherein the monitor intensity matrix indicates respective camera monitor intensities at different spatial positions within the spatial range;

acquire an operating intensity matrix according to camera operating log data of the spatial range, wherein the operating intensity matrix indicates respective camera operating intensities at different spatial positions within the spatial range;

calculate a correlation coefficient between the monitor intensity matrix and the operating intensity matrix and analyze a degree of rationality of a camera distribution within the spatial range based on the correlation coefficient.

15. The device according to claim 14, wherein when analyzing the degree of rationality of the camera distribution within the spatial range based on the correlation coefficient, the machine-executable instructions cause the processor to:

determining a coefficient interval to which the correlation coefficient belongs by comparing the correlation coefficient with at least two preset coefficient intervals; and determine the degree of rationality corresponding to the coefficient interval to which the correlation coefficient belongs as the degree of rationality of the camera distribution within the spatial range.

* * * * *